United States Patent
Fujii et al.

(10) Patent No.: US 6,623,843 B2
(45) Date of Patent: Sep. 23, 2003

(54) RESIN COMPOSITION FOR WIRING CIRCUIT BOARD, SUBSTRATE FOR WIRING CIRCUIT BOARD, AND WIRING CIRCUIT BOARD

(75) Inventors: Hirofumi Fujii, Osaka (JP); Shunichi Hayashi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/041,451

(22) Filed: Jan. 10, 2002

(65) Prior Publication Data

US 2002/0132095 A1 Sep. 19, 2002

(30) Foreign Application Priority Data

Jan. 17, 2001 (JP) ........................................ 2001-008935

(51) Int. Cl.$^7$ .................................................. B32B 3/00
(52) U.S. Cl. .................... 428/209; 428/473.5; 428/901; 174/258
(58) Field of Search .............................. 428/209, 473.5, 428/901; 174/258

(56) References Cited

U.S. PATENT DOCUMENTS

| | | | | | |
|---|---|---|---|---|---|
| 5,677,393 A | * | 10/1997 | Ohmori et al. | ............. | 525/423 |
| 5,914,385 A | * | 6/1999 | Hayashi et al. | ............. | 528/170 |
| 6,214,923 B1 | * | 4/2001 | Goto et al. | ................. | 524/514 |
| 6,217,996 B1 | * | 4/2001 | Yamamoto et al. | ......... | 428/220 |

* cited by examiner

*Primary Examiner*—Cathy Lam
(74) *Attorney, Agent, or Firm*—Sughrue Mion, PLLC

(57) ABSTRACT

The present invention provides a resin composition for a wiring circuit board; a substrate for a wiring circuit board in which a base insulating layer has been formed from the resin composition for a wiring circuit board; and a wiring circuit board having insulating layers including a cover insulating layer formed from the resin composition for a wiring circuit board. The resin composition for a wiring circuit board, the substrate for a wiring circuit board, and the wiring circuit board can prevent warpage and curling, increase adhesion between the insulating layer and the conductor layer, and enhance the durability and reliability of the wiring circuit board. The resin composition for a wiring circuit board contains a polyimide resin precursor, and a polyhydric phenol compound.

19 Claims, 1 Drawing Sheet

RESIN COMPOSITION FOR WIRING CIRCUIT BOARD, SUBSTRATE FOR WIRING CIRCUIT BOARD, AND WIRING CIRCUIT BOARD

BACKGROUND OF THE INVENTION

1. Field of the Invention

The present invention relates to a resin composition for a wiring circuit board, a substrate for a wiring circuit board, and a wiring circuit board. More specifically, the invention relates to a resin composition for a wiring circuit board, for use in the formation of insulating layers, such as a base insulating layer and a cover insulating layer, in the wiring circuit board; a substrate for a wiring circuit board in which a base insulating layer has been formed from the resin composition for a wiring circuit board; and a wiring circuit board having a cover insulating layer, etc. formed from the resin composition for a wiring circuit board.

2. Description of the Related Art

Polyimide resin has been widely used in insulating layers of a wiring circuit board, such as a base insulating layer and a cover insulating layer. Such a wiring circuit board is produced, for example, in the following manner: A solution of a polyimide resin precursor, such as polyamic acid resin, is coated onto a conductor layer comprising a copper foil or the like, dried and then cured to form a base insulating layer. These steps result in the preparation of a two-layer substrate for a wiring circuit board, which has the base insulating layer directly formed on the conductor layer. Then, the conductor layer is formed into a predetermined circuit pattern by a known patterning process such as the subtractive method. Then, a cover insulating layer comprising polyimide resin is coated onto the conductor layer of the predetermined circuit pattern to prepare a wiring circuit board.

To prevent the occurrence of warpage or curling in such a wiring circuit board, it is preferred to make the linear thermal expansion coefficient of the polyimide resin nearly as low as the linear thermal expansion coefficient of the conductor layer.

When the linear thermal expansion coefficient of the polyimide resin is decreased, however, adhesion of the polyimide resin to the conductor layer lowers. As a result, peeling between the insulating layer and the conductor layer is liable to occur, making it impossible to enhance the durability and reliability of the wiring circuit board.

SUMMARY OF THE INVENTION

The present invention has been accomplished in view of the foregoing circumstances. The object of the present invention is to provide a resin composition for a wiring circuit board; a substrate for a wiring circuit board, which has a base insulating layer containing the resin composition for a wiring circuit board; and a wiring circuit board having insulating layers, such as a cover insulating layer, containing the resin composition for a wiring circuit board, the resin composition, the substrate, and the wiring circuit board being capable of preventing warpage and curling, increasing the adhesion between the insulating layer and the conductor layer, and enhancing the durability and reliability of the wiring circuit board.

To achieve the above object, the present invention provides a resin composition for a wiring circuit board, comprising: a polyimide resin precursor; and a polyhydric phenol compound. Here the resin composition for a wiring circuit board may be used to form at least one of the insulating layers of the wiring circuit board.

The insulating layer may have a linear thermal expansion coefficient of 30 ppm or lower.

The polyimide resin precursor may be a polyamic acid resin.

The polyamic acid resin may have a repeating unit structure of the general formula (1)

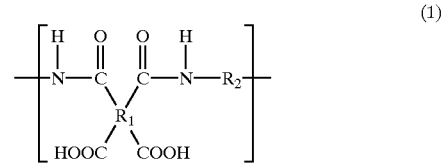

where $R_1$ represents a tetravalent organic group, and $R_2$ represents a divalent organic group.

The polyamic acid resin may have a weight average molecular weight of 5,000 to 200,000.

The polyamic acid resin may have a weight average molecular weight of 10,000 to 100,000.

The tetravalent organic group in the formula (1) may be selected from the group consisting of aromatic, araliphatic, aliphatic, and alicyclic tetravalent organic groups having skeletons including benzene, naphthalene, perylene, diphenyl, diphenyl ether, diphenyl sulfone, diphenylpropane, diphenylhexafluoropropane, benzophenone, butane, and cyclobutane.

The divalent organic group in the formula (1) may be selected from the group consisting of aromatic, araliphatic, aliphatic, and alicyclic divalent organic groups having skeletons including diphenyl ether, benzophenone, diphenylmethane, diphenylpropane, diphenylhexafluoropropane, diphenyl sulfoxide, diphenyl sulfone, diphenyl, benzene, and diphenoxybenzene.

The polyhydric phenol compound may be a phenolic novolak resin.

The polyhydric phenol compound may have a weight average molecular weight of 100 to 3,000.

The polyhydric phenol compound may be blended in an amount of 1 to 30 parts by weight for 100 parts by weight of the polyimide resin precursor.

The present invention also provides a substrate for a wiring circuit board, comprising an insulating layer on a conductor layer, the insulating layer being formed from the resin composition for a wiring circuit board. Here the substrate for a wiring circuit board may be a laminate composed of two layers.

The present invention also provides a wiring circuit board, further including an insulating layer on a conductor layer of a predetermined pattern formed from the substrate for a wiring circuit board, the insulating layer being formed from the resin composition for a wiring circuit board.

The above and other objects, effects, features and advantages of the present invention will become more apparent from the detailed description to follow taken in conjunction with the accompanying drawings.

Figure 1A:
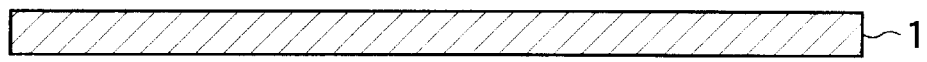
FIGS. 1(a) to 1(e) are sectional views showing an embodiment of a method which prepares a two-layer substrate for a wiring circuit board by use of the resin composition for a wiring circuit board according to the present invention, and then produces a wiring circuit board with the use of the substrate, in which 1(*a*) is a sectional view of a conductor layer.

1(*b*) shows the step of coating the resin composition for a wiring circuit board onto the conductor layer, and then drying the coating to form a film;

1(*c*) shows the step of curing the film to form a base insulating layer;

1(*d*) shows the step of processing the conductor layer into a predetermined circuit pattern; and 1(*e*) shows the step of coating a cover insulating layer onto the conductor layer processed into the predetermined circuit pattern.

DETAILED DESCRIPTION

The resin composition for a wiring circuit board according to the present invention contains a polyimide resin precursor, and a polyhydric phenol compound.

The polyimide resin precursor for use in the present invention is a resin composition which, when cured, can become a polyimide resin. An example of the polyimide resin precursor is a polyamic acid resin. A preferred mode of the polyamic acid resin used in the present invention has, but is not limited to, a repeating unit structure of the general formula (1) indicated below. The weight average molecular weight of the preferred polyamide acid resin is preferably about 5,000 to 200,000, more preferably about 10,000 to 100,000.

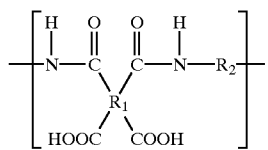

where $R_1$ represents a tetravalent organic group, and $R_2$ represents a divalent organic group.

Examples of the tetravalent organic group designated as $R_1$ in the formula (1) are aromatic, araliphatic, aliphatic, and alicyclic tetravalent organic groups having skeletons, such as benzene, naphthalene, perylene, diphenyl, diphenyl ether, diphenyl sulfone, diphenylpropane, diphenylhexafluoropropane, benzophenone, butane, and cyclobutane. Preferred examples are aromatic, araliphatic, aliphatic, and alicyclic tetravalent organic groups having skeletons, such as benzene, diphenyl, diphenylhexafluoropropane, and benzophenone. These tetravalent organic groups may be used alone or in combination of two or more.

Examples of the divalent organic group designated as $R_2$ in the formula (1) are aromatic, araliphatic, aliphatic, and alicyclic divalent organic groups having skeletons, such as diphenyl ether, benzophenone, diphenylmethane, diphenylpropane, diphenylhexafluoropropane, diphenyl sulfoxide, diphenyl sulfone, diphenyl, benzene, and diphenoxybenzene. Preferred examples are aromatic, araliphatic, aliphatic, and alicyclic divalent organic groups having skeletons, such as diphenyl ether, benzene, and diphenoxybenzene. These divalent organic groups may be used alone or in combination of two or more.

The above polyamic acid resin can be obtained, for example, by reacting an organic tetracarboxylic acid dianhydride with a diamine. Examples of the organic tetracarboxylic acid dianhydride include pyromellitic acid dianhydride, 3,3',4,4'-biphenyltetracarboxylic acid dianhydride, 2,2-bis (2,3-dicarboxyphenyl)-1,1,1,3,3,3-hexafluoropropane dianhydride, 2,2-bis(3,4-dicarboxyphenyl)-1,1,1,3,3,3-hexafluoropropane dianhydride, 3,3',4,4'-benzophenonetetracarboxylic acid dianhydride, bis (3,4-dicarboxyphenyl) ether dianhydride, and bis(3,4-dicarboxyphenyl) sulfonic acid dianhydride. These organic tetracarboxylic acid dianhydrides may be used alone or in combination of two or more.

Examples of the diamine include m-phenylenediamine, p-phenylenediamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl) propane, 2,2-bis(4-aminophenoxyphenyl) hexafluoropropane, 1,3-bis(4-aminophenoxy) benzene, 1,4-bis(4-aminophenoxy)benzene, 2,4-diaminotoluene, 2,6-diaminotoluene, diaminodiphenylmethane, 4,4'-diamino-2, 2-dimethylbiphenyl, and 2,2-bis(trifluoromethyl) -4,4'-diaminobiphenyl. These diamines may be used alone or in combination of two or more.

The polyamic acid resin may be obtained as a solution of the polyamic acid resin by reacting the organic tetracarboxylic acid dianhydride and the diamine in substantially equimolar proportions in a suitable organic solvent, for example, a polar solvent such as N-methyl-2-pyrrolidone, N,N-dimethylacetamide, N,N-dimethylformamide, dimethyl sulfoxide, or hexamethylphosphoramide, usually for 1 to 48 hours at 0 to 90° C.

The linear thermal expansion coefficient of the insulating layer containing the polyimide resin can be made lower by using the polyamic acid resin produced with the use of 3,3',4,4'-biphenyltetracarboxylic dianhydride among the above organic tetracarboxylic acid dianhydrides, and with the use of p-phenylenediamine, 4,4'-diamino-2,2-dimethylbiphenyl, or 2,2-bis(trifluoromethyl)-4,4'-diaminobiphenyl among the above diamines.

Examples of the polyhydric phenol compound used in the present invention include 2,2'-dihydroxybiphenyl, 4,4'-dihydroxybiphenyl, 4,4'-methylenebisphenol, 1,1-bis(4-hydroxyphenyl) ethane, 2,2-bis(4-hydroxyphenyl)propane, 2,2-bis(4-hydroxyphenyl) hexafluoropropane, phenolic novolac resin, and cresol novolac resin. These polyhydric phenol compounds may be used alone or in combination of two or more. The weight average molecular weight of the polyhydric phenol compound is preferably within the range of 100 to 3,000. If its weight average molecular weight is less than 100, the polyhydric phenol compound may volatilize during imidization upon heating. If its weight average molecular weight is higher than 3,000, the polyhydric phenol compound may undergo phase separation from the polyimide resin, making uniform dispersion or dissolution impossible.

By using phenolic novolak resin among the above-mentioned polyhydric phenol compounds, the adhesion of the insulating layer containing the polyimide resin can be further enhanced. Particularly when phenolic novolak resin with a weight average molecular weight of 350 to 1,500 is used, satisfactory adhesion can be exhibited, even though the linear thermal expansion coefficient of the insulating layer is low.

The polyhydric phenol compound is blended in an amount of, preferably, 1 to 30 parts by weight, more preferably 3 to 20 parts by weight, for 100 parts by weight of the polyimide resin precursor. If the amount of the polyhydric phenol compound blended is less than 1 part by weight, satisfactory adhesion may fail to be exhibited. If its amount blended is more than 30 parts by weight, the characteristics of the resulting polyimide film may decline.

The resin composition for a wiring circuit board according to the present invention can be prepared by obtaining the polyimide resin precursor, for example, as a solution of the polyamic acid resin as stated earlier, then blending the polyhydric phenol compound in the aforementioned proportion, and mixing and dissolving these materials.

The resin composition for a wiring circuit board according to the present invention may contain, for example, a photosensitizer such as a 1,4-dihydropyrodine derivative. In this case, a photosensitive resin composition for a wiring circuit board is prepared. If prepared as a photosensitive resin composition for a wiring circuit board, the resin composition for a wiring circuit board can form an insulating layer of a predetermined pattern by photolithography comprising exposure and development. The photosensitizer is preferably blended, usually, in an amount of 0.1 to 1.0 mol per mol of the polyimide resin precursor. Alternatively, the photosensitive resin composition for a wiring circuit board can be prepared, for example, by introducing a functional group having photosensitivity into the skeleton of the polyamic acid resin.

Where necessary, an epoxy resin, bisallylnadic imide, or maleimide may further be blended into the resin composition for a wiring circuit board according to the present invention.

The resin composition for a wiring circuit board according to the present invention is preferably used for the formation of a base insulating layer, an intermediate insulating layer, and a cover insulating layer of a wiring circuit board.

The resin composition for a wiring circuit board according to the present invention may be used as an insulating layer of a wiring circuit board, for example, in the following manner (the details will be described later on): The resin composition for a wiring circuit board according to the present invention is coated onto a predetermined conductor layer by a publicly known method, and dried to form a film, which is then heated for curing. The linear thermal expansion coefficient of the resulting insulating layer is 30 ppm or less, preferably 10 to 30 ppm. If the linear thermal expansion coefficient of the insulating layer exceeds 30 ppm, warpage or curling may occur in the insulating layer, or dimensional accuracy during the manufacturing process may be poor. As a result, when a terminal is formed, the positional accuracy of the position of terminal formation may be harmed.

Herein, a two-layer laminate having a base insulating layer on a conductor layer is called a substrate for a wiring circuit board. The substrate for a wiring circuit board is preferably used in the formation of a wiring circuit board. The resin composition for a wiring circuit board according to the present invention is used, for example, in forming a base insulating layer on a conductor layer.

Examples of the wiring circuit board include, but are not limited to, wiring circuit boards or multilayer wiring circuit boards used in electric equipment and electronic equipment, such as flexible wiring circuit boards or suspension boards with circuits. The resin composition for a wiring circuit board according to the present invention can be used for various insulating layers, such as a base insulating layer and a cover insulating layer of a wiring circuit board, and an intermediate insulating layer of a multilayer wiring circuit board.

If the insulating layer of a wiring circuit board is formed from the resin composition for a wiring circuit board according to the present invention, the insulating layer minimally warps or curls, the adhesion between the insulating layer and the conductor layer is high, and the durability and reliability of the resulting wiring circuit board can be enhanced.

Next, a method, which produces a two-layer substrate for a wiring circuit board by use of the resin composition for a wiring circuit board according to the present invention, and produces a wiring circuit board by use of the substrate for a wiring circuit board, will be described with reference to FIGS. 1(a) to 1(e).

Figure 1B:
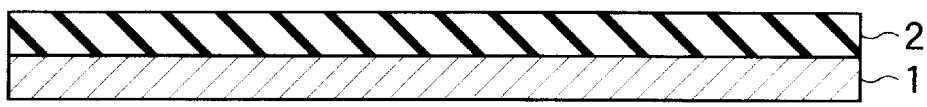

To prepare the two-layer substrate, a conductor layer 1 is made ready for use, as shown in FIG. 1(a). The resin composition for a wiring circuit board according to the present invention is coated onto the conductor layer 1, and then dried to form a film 2, as shown in FIG. 1(b).

A foil or a sheet of a metal or its alloy, such as copper, chromium, nickel, aluminum, stainless steel, copper-beryllium, phosphor bronze, or iron-nickel, is used as the conductor layer 1. The conductor layer 1 may be such a foil or sheet whose surface is coated with an electroless nickel plating, an organic rust preventive film, or an inorganic rust preventive film. The thickness of the conductor layer 1 is preferably 5 to 100 μm, more preferably 10 to 50 μm.

Coating with the resin composition for a wiring circuit board may be performed, for example, by preparing the resin composition for a wiring circuit board as a solution of the polyamic acid resin, and applying the solution by a publicly known method such as spin coating or bar coating. After coating, the applied resin composition may be heat dried at 50 to 120° C. by hot air drying. The coating is carried out such that the thickness of the film after drying is preferably 3 to 100 μm, more preferably 5 to 50 μm.

Figure 1C:
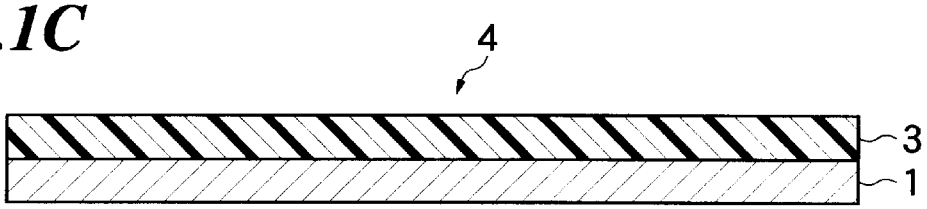

Then, as shown in FIG. 1(c), the heat dried film 2 of the resin composition for a wiring circuit board is cured to form a base insulating layer 3 on the conductor layer 1 directly. Through these steps, a two-layer substrate 4 for a wiring circuit board is obtained. Curing of the film 2 can be performed by a publicly known method. For example, heating at 300 to 500° C. imidizes the polyimide resin precursor, forming the base insulating layer 3 consisting essentially of polyimide resin.

When the resin composition for a wiring circuit board according to the present invention is prepared as a photosensitive resin composition for a wiring circuit board, the film 2 can be formed into a predetermined pattern by irradiating the resulting film 2 in FIG. 1 (b) with actinic rays via a photomask, followed by heating, if desired, to form a latent image, and developing the latent image (by, for example, photolithography). The film 2 of the predetermined pattern is cured, whereby a substrate for a wiring circuit board can be obtained in which the base insulating layer 3 having the predetermined pattern has been directly formed on the conductor layer 1.

Figure 1D:
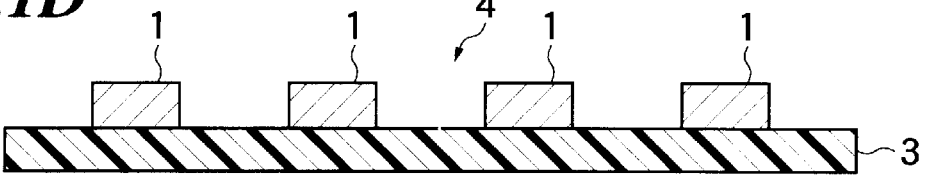
Figure 1E:
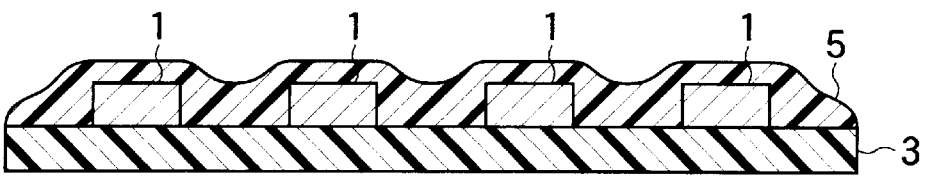

Next, a description will be offered of a method for preparing a wiring circuit board by use of the thus obtained two-layer substrate 4 for a wiring circuit board. As shown in FIG. 1(d), the conductor layer 1 of the substrate 4 for a wiring circuit board is formed into a predetermined circuit pattern. Then, as shown in FIG. 1(e), a cover insulating layer 5 is formed so as to cover the conductor layer 1 formed in the predetermined circuit pattern. FIGS. 1(d) and 1(e) are shown upside down relative to FIGS. 1(a) to 1(c).

To form the conductor layer 1 into the predetermined circuit pattern, a publicly known patterning method, such as the subtractive method, may be employed. A metallic thin film, for example, of copper, chromium, nickel, gold or solder may be formed on the conductor layer 1 of the predetermined circuit pattern by electroplating, electroless plating, vacuum deposition, or sputter deposition.

The cover insulating layer 5 may be formed, for example, by acquiring a resin film comprising polyimide resin or the like, bonding the resin film to the conductor layer 1 via an adhesive layer, or by applying a coating solution containing the resin composition for a wiring circuit board according to the present invention onto the conductor layer 1 formed in the predetermined circuit pattern, and then drying and curing the coating. The thickness of the cover insulating layer 5 is preferably 2 to 50 μm, more preferably 5 to 25 μm.

For a wiring circuit board, it is the usual practice that via holes for terminal connection are formed at predetermined positions of the cover insulating layer 5 by a publicly known method, such as drilling, laser beam machining, or etching, and connecting terminals are formed in the via holes by solder bumps or gold plating.

To form the cover insulating layer 5, a photosensitive resin composition for a wiring circuit board may be used as the resin composition for a wiring circuit board. In this case, after the film is formed as described above, exposure and development are performed, for example, by photolithography, whereby the cover insulating layer 5 having a predetermined pattern can be formed. Thus, via holes for connecting terminals, for example, can be formed simultaneously with the formation of the cover insulating layer 5.

EXAMPLES

The present invention will be described in greater detail by Examples and Comparative Example, but the present invention is in no way restricted thereby.

Examples 1 to 5

100 Grams of 3,3',4,4'-biphenyltetracarboxylic acid dianhydride, 31.2 g of p-phenylenediamine, and 10.1 g of 4,4'-diaminodiphenyl ether were reacted in 800 g of N-methyl-2-pyrrolidone to prepare a solution of polyamic acid resin.

Phenolic novolak resin A or phenolic novolak resin B, blended below, was blended in the proportion shown in Table 1, based on 100 parts by weight of the polyamic acid resin, into the solution of the polyamic acid resin prepared above. By this procedure, resin compositions for a wiring circuit board, as Examples 1 to 5, were prepared.

Phenolic novolak resin A:

Trade name "Tamanol P-180," produced by Arakawa Kagaku, weight average molecular weight 1,000

Phenolic novolak resin B:

Trade name "Tamanol P-100," produced by Arakawa Kagaku, weight average molecular weight 350

Comparative Example 1

A resin composition for a wiring circuit board was prepared in the same manner as in Example 1, except that the phenolic novolak resin A was not blended.
Evaluation:

A conductor layer A or a conductor layer B, shown below, was coated with the resin composition for a wiring circuit board of each of Examples 1 to 5 and Comparative Example 1 in the combination indicated in Table 1, and the coating was dried for 20 minutes at 100° C. Then, the resulting film was heat treated at 330° C. in the case of the conductor layer A, or 370° C. in the case of the conductor layer B, to cure the film of the resin composition for a wiring circuit board.

Conductor layer A: A rolled copper foil of 18 μm in thickness (coating was done on its shining surface)

Conductor layer B: Conductor layer A on whose shining surface electroless nickel plating was performed (coating was done on the electroless nickel plated surface)

Then, the conductor layer was etched with an aqueous solution of ferric chloride to form a pattern of 10 mm in width. The adhesion between the conductor layer and the base insulating layer was measured by a 90° peeling test. The tensile testing speed of the peeling test was 50 mm/min. The results are shown in Table 1.

The curing product of each of the resin compositions for a wiring circuit board of Examples 1 to 5 and Comparative Example 1 was measured for linear thermal expansion coefficient by TMA (thermomechanical analysis) (thermal analyzer "Thermo Plus" and thermomechanical analyzer "TMA8310" produced by Rigaku K.K.). The results are shown in Table 1.

TABLE 1

| Example Comp. Example | Phenolic novolak resin | | Type of conductor layer | Adhesion (N/m) | Linear thermal expansion coefficient (ppm) |
|---|---|---|---|---|---|
| | Type of resin | Parts by weight | | | |
| Ex. 1 | A | 5 | B | 480 | 17 |
| Ex. 2 | A | 10 | B | 954 | 19 |
| | | | A | 1130 | |
| Ex. 3 | A | 15 | B | 984 | 20 |
| Ex. 4 | A | 20 | B | 966 | 21 |
| Ex. 5 | B | 20 | B | 1010 | 20 |
| Comp. Ex. 1 | — | — | B | 370 | 17 |
| | | | A | 340 | |

As shown in Table 1, the wiring circuit boards having the insulating layer formed with the use of the resin compositions for a wiring circuit board, as Examples 1 to 5, had excellent adhesion of 480 N/m or higher, and proved excellent in durability and reliability as wiring circuit boards. On the other hand, the wiring circuit board having the insulating layer formed with the use of the phenolic novolak resin-free resin composition for a wiring circuit board, as Comparative Example 1, showed low adhesion, and proved poor in durability, etc. as a wiring circuit board. The wiring circuit boards formed with the use of the resin compositions for a wiring circuit board, as Examples 1 to 5 according to the present invention, underwent neither warpage nor curling.

When the resin composition for a wiring circuit board according to the present invention is used, the resulting substrate for a wiring circuit board and the resulting wiring circuit board undergo minimal warpage and curling, and have high adhesion between the insulating layer and the conductor layer. According to the present invention, therefore, the durability and reliability of the resulting wiring circuit board can be enhanced.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A substrate for a wiring circuit board, comprising:

a conductor layer;

an insulating layer formed on said conductor layer, said insulating layer being formed from a resin composition comprising a polyimide resin precursor, and a polyhydric phenol compound;

wherein said resin composition does not have an epoxy resin.

2. A substrate for a wiring circuit board as claimed in claim 1, which is a two-layer laminate comprising the insulating layer formed directly on the conductor layer.

3. A substrate as claimed in claim 1, wherein the insulating layer has a linear thermal expansion coefficient of 30 ppm or lower.

4. A substrate as claimed in claim 1, wherein the polyimide resin precursor is a polyamic acid resin.

5. A substrate as claimed in claim 4, wherein the polyamic acid resin has a repeating unit structure of the general formula (1)

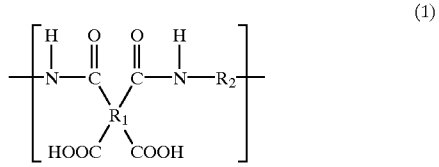

where $R_1$ represents a tetravalent organic group, and $R_2$ represents a divalent organic group.

6. A substrate as claimed in claim 4, wherein the polyamic acid resin has a weight average molecular weight of 5,000 to 200,000.

7. A substrate as claimed in claim 4, wherein the polyamic acid resin has a weight average molecular weight of 10,000 to 100,000.

8. A substrate as claimed in claim 5, wherein the tetravalent organic group in the formula (1) is selected from the group consisting of aromatic, araliphatic, aliphatic, and alicyclic tetravalent organic groups having skeletons including benzene, naphthalene, perylene, diphenyl, diphenyl ether, diphenyl sulfone, diphenylpropane, diphenylhexafluoropropane, benzophenone, butane, and cyclobutane.

9. A substrate as claimed in claim 5, wherein the divalent organic group in the formula (1) is selected from the group consisting of aromatic, araliphatic, aliphatic, and alicyclic divalent organic groups having skeletons including diphenyl ether, benzophenone, diphenylmethane, diphenylpropane, diphenylhexafluoropropane, diphenyl sulfoxide, diphenyl sulfone, diphenyl, benzene, and diphenoxybenzene.

10. A substrate as claimed in claim 1, wherein the polyhydric phenol compound is a phenolic novolak resin.

11. A substrate as claimed in claim 1, wherein the polyhydric phenol compound has a weight average molecular weight of 100 to 3,000.

12. A substrate as claimed in claim 1, wherein the polyhydric phenol compound is blended in an amount of 1 to 30 parts by weight for 100 parts by weight of the polyimide resin precursor.

13. A substrate as claimed in claim 1, wherein the thickness of the conductor layer is in a range of $5\mu$–$100\mu$ and the thickness of the insulator layer is in a range of $3\mu$–$100\mu$.

14. A substrate as claimed in claim 13, wherein the thickness of the conductor layer is in a range of $10\mu$–$50\mu$ and the thickness of the insulator layer is in a range of $5\mu$–$50\mu$.

15. A substrate as claimed in claim 1, wherein the insulating layer is patterned.

16. A substrate as claimed in claim 1, wherein the conductive layer is patterned.

17. A substrate as claimed in claim 1, wherein the conductive layer is patterned and covered with an insulating layer.

18. A wiring circuit board comprising:

a substrate comprising a conductor layer formed with a predetermined pattern and an insulating layer formed from a resin composition comprising a polyimide resin precursor, and a polyhydric phenol compound wherein said resin composition does not have an epoxy resin; and said insulating layer envelops said conductor layer formed with a predetermined pattern.

19. A wiring circuit board comprising, a substrate for a wiring circuit board, said substrate having a conductor layer and an insulating layer formed on said conductor layer, said insulating layer being formed from a resin composition comprising a polyimide resin precursor, and a polyhydric phenol compound wherein said resin composition does not have an epoxy resin.

* * * * *